United States Patent
Tandon et al.

(10) Patent No.: US 7,269,196 B2
(45) Date of Patent: Sep. 11, 2007

(54) METHOD FOR INCREASING MAXIMUM MODULATION SPEED OF A LIGHT EMITTING DEVICE, AND LIGHT EMITTING DEVICE WITH INCREASED MAXIMUM MODULATION SPEED AND QUANTUM WELL STRUCTURE THEREOF

(75) Inventors: Ashish Tandon, Sunnyvale, CA (US); Michael R. T. Tan, Menlo Park, CA (US); Ying-Lan Chang, Cupertino, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 316 days.

(21) Appl. No.: 10/885,952

(22) Filed: Jul. 6, 2004

(65) Prior Publication Data
US 2006/0007974 A1 Jan. 12, 2006

(51) Int. Cl.
*H01S 5/00* (2006.01)

(52) U.S. Cl. .................... 372/45.01; 372/43.01

(58) Field of Classification Search ............ 372/45, 372/43
See application file for complete search history.

(56) References Cited

U.S. PATENT DOCUMENTS

| 2001/0017875 A1 | 8/2001 | Fukunaga et al. |
| 2002/0114367 A1* | 8/2002 | Stintz et al. .................. 372/45 |
| 2003/0103542 A1 | 6/2003 | Cox et al. |
| 2004/0016921 A1 | 1/2004 | Botez et al. |
| 2004/0105474 A1 | 6/2004 | Ohkubo et al. |

FOREIGN PATENT DOCUMENTS

JP   08056045 A   *   2/1996

OTHER PUBLICATIONS

S. W. Corzine, et al.; "Theoretical Gain In Strained-Layer Quantum Wells"; Department of Electrical and Computer Engineering, University of California at Santa Barbara; 12 pages.

* cited by examiner

*Primary Examiner*—Dung Nguyen

(57) ABSTRACT

The method comprises forming barrier layers of $Al_xGa_{1-x}As$, forming a quantum well layer of InGaAs between the barrier layers, and forming an interfacial layer between the quantum well layer and each of the barrier layers.

15 Claims, 11 Drawing Sheets

METHOD FOR INCREASING MAXIMUM MODULATION SPEED OF A LIGHT EMITTING DEVICE, AND LIGHT EMITTING DEVICE WITH INCREASED MAXIMUM MODULATION SPEED AND QUANTUM WELL STRUCTURE THEREOF

BACKGROUND

Light-emitting devices such as vertical-cavity surface-emitting lasers (VCSELs) are known in the art. The active region of a VCSEL has a quantum well structure composed of one or more quantum well layers interleaved with a corresponding number of barrier layers. Each quantum well layer forms a quantum well with the adjacent barrier layers. The quantum well captures and confines carriers (electrons and holes), which subsequently radiatively recombine to generate light.

The active region of a conventional VCSEL that generates light at a wavelength of 850 nanometers (nm) has a quantum well structure composed of quantum well layers of gallium arsenide (GaAs) and barrier layers of aluminum gallium arsenide (AlGaAs). However, using indium gallium arsenide (InGaAs) instead of GaAs as the material of the quantum well layers is advantageous because strain increases the differential gain and reduces the transparency current, both of which are beneficial to high speed operation, reliability and driver circuitry. The quantum well structure of a typical conventional VCSEL that generates light at a wavelength of 980 nm has quantum well layers of indium gallium arsenide (InGaAs) and barrier layers of gallium arsenide (GaAs) or quantum well layers of indium gallium arsenide (InGaAs) and barrier layers of gallium arsenide phosphide (GaAsP).

However, a conventional 980 nm VCSEL has a lower maximum modulation speed and inferior temperature performance compared to a conventional 850 nm VCSEL.

Accordingly, what is needed is a way to increase the maximum modulation speed and to improve the temperature performance of 980 nm VCSELs and other light-emitting devices that generate light at this wavelength.

SUMMARY

Embodiments of the present invention pertain to light-emitting devices with increased maximum modulation speeds. One example pertains to a method for increasing the modulation speed of a light emitting device. The method comprises forming $Al_xGa_{1-x}As$ barrier layers, forming an indium gallium arsenide (InGaAs) quantum well layer between the barrier layers, and forming interfacial layers between the quantum well layer and the barrier layers. The interfacial layers increase carrier confinement in the quantum well layer of the quantum well and, hence, the maximum modulation speed of the light emitting device.

Another embodiment provides a vertical cavity surface emitting laser (VCSEL). The VCSEL has a quantum well structure comprising InGaAs quantum well layers interleaved with $Al_xGa_{1-x}As$ barrier layers. The VCSEL additionally has an element that increases carrier confinement in the quantum well structure, which increases the maximum modulation speed of the VCSEL.

Another embodiment provides a quantum well structure for a light emitting device. The quantum well structure has barrier layers, InGaAs quantum well layers interleaved with the barrier layers and, between each quantum well layer and each adjacent barrier layer, an interfacial layer of a material that mitigates the effect of imperfect interfacing between the quantum well layer and the adjacent barrier layer. The interfacial layers beneficially reduce broadening of the gain spectrum and non-radiative recombination centers in the quantum well that would otherwise be caused by the imperfect interfacing between the quantum well layer and the adjacent barrier layers.

DETAILED DESCRIPTION

Carrier confinement is one factor that determines the material gain of the quantum well structure of the 980 nm VCSEL. Increased carrier confinement provides a material gain that increases the differential gain of the quantum well structure. Differential gain is defined as the differential of the material gain with respect to the injected carrier density. Moreover, the relaxation frequency of a VCSEL is directly proportional to the differential gain and, hence, to carrier capture in the quantum well structure of the VCSEL. The relaxation frequency characterizes the natural oscillation of electrons and photons when the VCSEL is generating light, and defines the maximum modulation speed of the VCSEL. Therefore, increasing carrier confinement provides a way to increase differential gain, to increase relaxation frequency, and, therefore, to increase the maximum modulation speed of the laser or VCSEL. Increasing the carrier confinement also improves the temperature performance of the VCSEL or other light-emitting device.

Prior work has been done to address the issue of optimizing the performance of strained quantum well structures. In particular, in Theoretical Gain in Strained-layer Quantum Wells" 1850 PROC. SPIE 177-188 (the "Corzine reference"), Corzine et al. theoretically discuss various physical effects that maximize the gain of strained quantum wells. The Corzine reference discusses the theoretical improvement of differential gain through increased carrier density in the active region.

However, as light emitting devices, such as VCSELs, go to higher modulation speeds, the characteristics of the quantum well structure are subject to increased scrutiny. As such, parameters that were not of interest previously are becoming increasingly important. Shortcomings in previous techniques become apparent as modulation speeds of the VCSELs increase. Also, increasing wavelength of the VCSEL demands a closer look at these shortcomings. For example, factors such as carrier confinement, carrier capture rate, and carrier escape rate become increasingly important. Much of the prior work, such as the Corzine reference, does not address these issues.

In particular, carrier confinement is dependent on the ratio of capture rate to escape rate of carriers in the quantum well structure. Conventional 980 nm VCSELs have a quantum well structure composed of InGaAs quantum well layers and GaAs barrier layers in which the indium fraction in the InGaAs of the quantum well layers is less than 20 percent. Such a quantum well structure provides a carrier confinement that is insufficient to allow the VCSEL to attain a desired maximum modulation speed.

TERMINOLOGY AND OVERVIEW

Figure 1A:
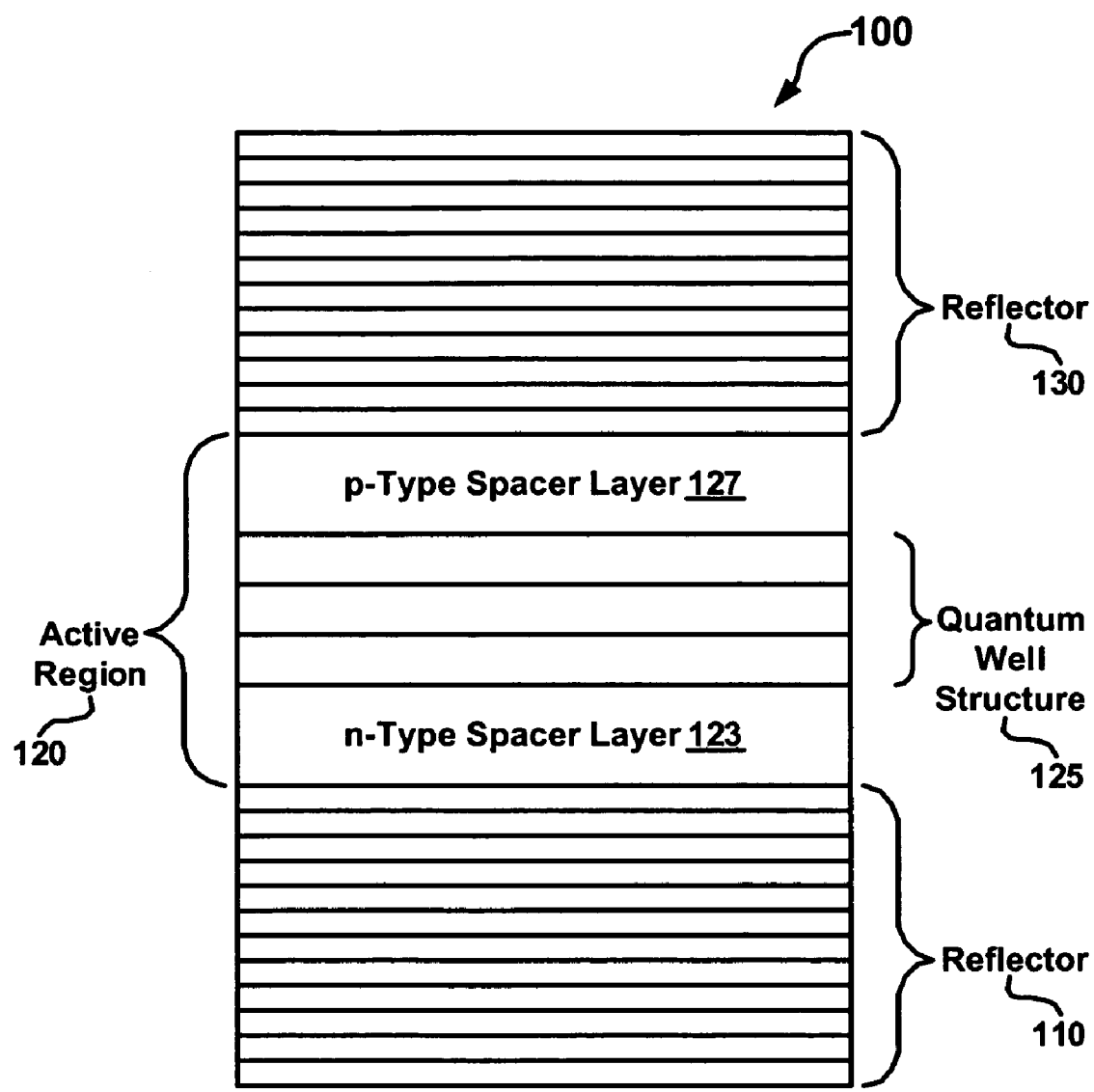
FIG. 1A is a cross-sectional view of a portion of a semiconductor laser exemplifying a light-emitting device incorporating embodiments of the present invention.

FIG. 1A is a schematic diagram illustrating a cross-sectional view of a portion of an embodiment of a light-emitting device 100 in accordance with the invention. In the example shown, light emitting device 100 is a vertical-cavity surface-emitting laser (VCSEL).

Light emitting device 100 has a first reflector 110 and a second reflector 130 with an active region 120 located between the reflectors. Typically, the first reflector 110 and the second reflector 130 are distributed Bragg reflectors (DBRs).

First reflector 110 and second reflector 130 collectively define an optical cavity in which active region 120 is located. Active region 120 is composed of a quantum well structure 125 sandwiched between an n-type spacer layer 123 and a p-type spacer layer 127. Typically, in a VCSEL in accordance with an embodiment of the present invention, the quantum well structure 125 defines between one and five quantum wells. However, the invention is not limited to a quantum well structure that defines this number of quantum wells.

N-type spacer layer 123 and p-type spacer layer 127 respectively inject electrons and holes (collectively referred to as "carriers") into quantum well structure 125. A hole is a bond missing an electron. Holes are capable of moving in a semiconductor material but are typically less mobile than electrons. The carriers are captured by and are confined in the quantum wells defined by the quantum well structure 125. The electrons and holes confined in the quantum wells of the quantum well structure 125 recombine to generate light (e.g., at a wavelength of 980 nm).

VCSEL 100 is an example of a light-emitting device in accordance with the invention. However, the invention is not limited to VCSELs. Embodiments of the invention are applicable to other types of light-emitting devices, such as, but not limited to, edge-emitting lasers and optical amplifiers such as the optical gain medium of an electrically-pumped external cavity laser.

Figure 1B:
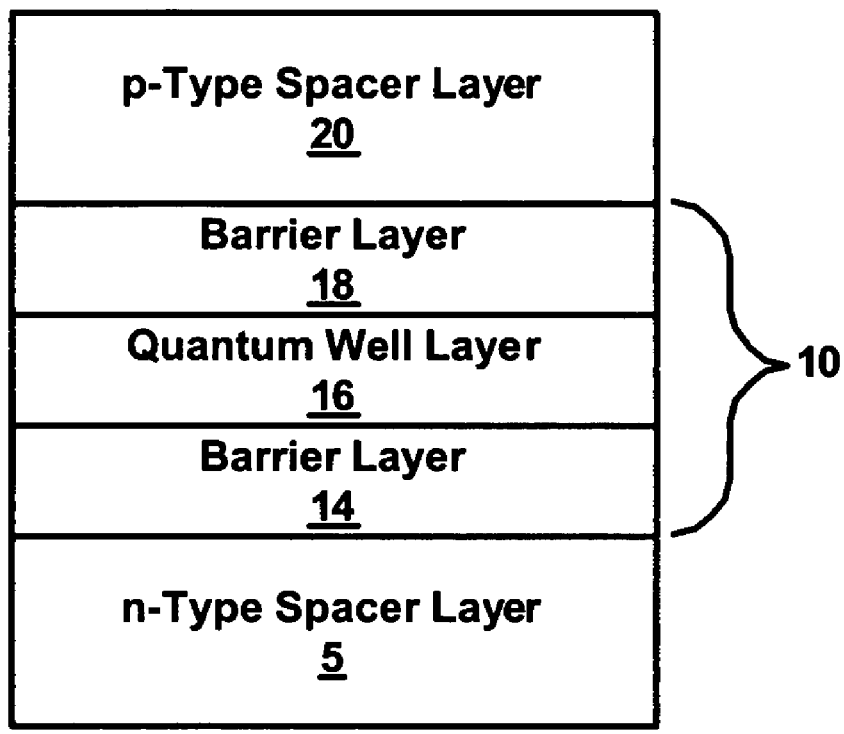
FIG. 1B is a cross-sectional view of the quantum well structure of a conventional light-emitting device.

As noted above, the active region of a light-emitting device, such as a 980 nm VCSEL, incorporates a quantum well structure that defines one or more quantum wells. FIG. 1B is a cross-sectional view of the active region of a conventional light-emitting device (not shown). The active region is composed of a quantum well structure 10 between an n-type spacer layer 5 and a p-type spacer layer 20. In the example shown in FIG. 1B, quantum well structure 10 is composed of a quantum well layer of a semiconductor material having a low band gap energy (a low band gap material) interleaved with barrier layers of a semiconductor material having a band gap energy greater than that of the low band gap material (a high band-gap material). Quantum well structure 10 defines a single quantum well and is composed of quantum well layer 16 sandwiched between barrier layers 14 and 18.

In other conventional light-emitting device embodiments, quantum well structure 10 is composed of N quantum well layers interleaved with N+1 barrier layers. The quantum well structure typically defines between one quantum well (N=1) and five quantum wells (N=5), although quantum well structures that define more than five quantum wells are known.

In a 980 nm VCSEL, the low band-gap material of quantum well layer 16 is indium gallium arsenide (InGaAs) and the high band gap material of barrier layers 14 and 18 is gallium arsenide (GaAs).

Figure 1C:
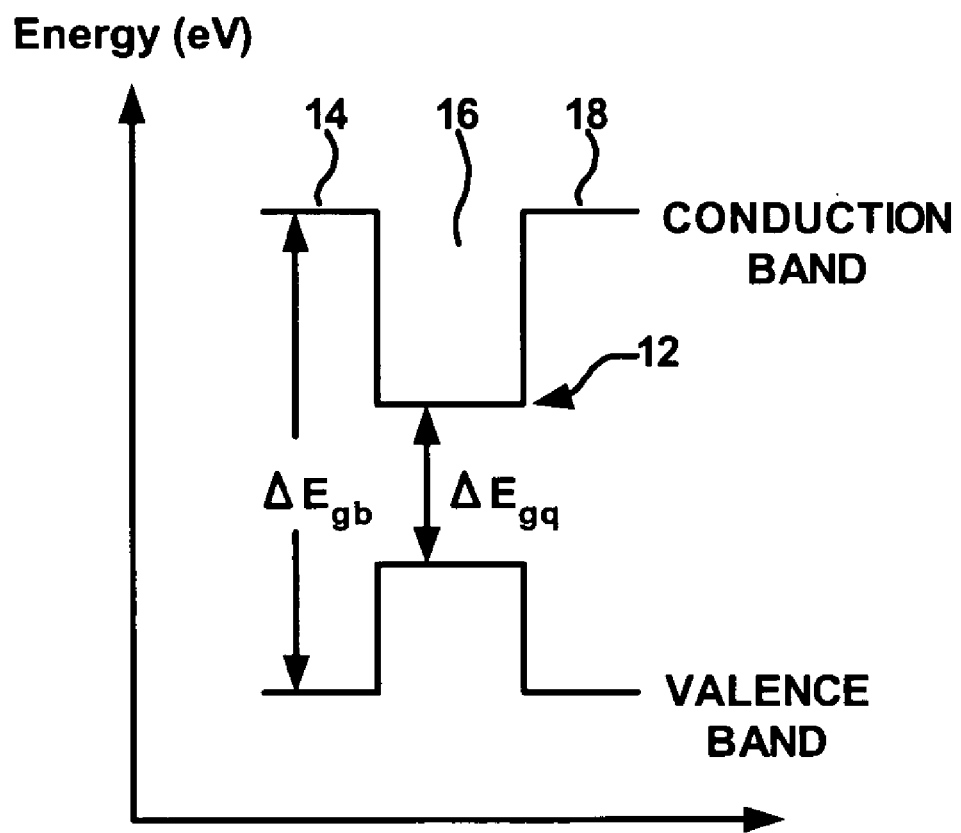
FIG. 1C is an energy diagram showing the band energy profile of the quantum well structure shown in FIG. 1B.

FIG. 1C is an energy diagram showing the band energy profile of quantum well structure 10 shown in FIG. 1B. The band energy profile shows the variation of band energy between the quantum well layer 16, barrier layer 14, and barrier layer 18 in the valence band and in the conduction band. FIG. 1C shows the difference in band gap energy (i.e., the difference between the conduction band energy and the valence band energy) between the low band-gap material of quantum well layer 16 and the high band-gap material of barrier layers 14 and 18. The difference in band gap energy between the quantum well layer 16 and the barrier layers 14 and 18 defines a quantum well 12. In the example shown, the band gap energy changes abruptly at the interfaces between the quantum well layer 16 and the barrier layers 14 and 18.

During operation of a light-emitting device incorporating quantum well structure 10, n-type spacer layer 5 and p-type spacer layer 20 respectively inject electrons and holes, as carriers, into the quantum well structure 10. A fraction of the carriers injected into the quantum well structure 10 is captured by and confined in quantum well layer 16. The electrons and holes confined in quantum well layer 16 recombine to generate light. Part of the light generated by this recombination is emitted by the light-emitting device.

One approach considered by the inventors for increasing the confinement of carriers in the InGaAs/GaAs quantum wells of the active region of a VCSEL (e.g., a 980 nm VCSEL) is increasing the thickness of the InGaAs quantum well layer. The carrier capture rate of the quantum well layer increases as the thickness of the quantum well layer is increased. However, increasing the thickness of the quantum well layer deleteriously reduces the energy spacing between different subband energy levels. This leads to increased carrier distribution at higher states above the ground state in the quantum well. Such a carrier distribution results in a lower differential gain since the quasi-Fermi levels are moved away from the band edges at transparency. Additionally, the thickness and indium fraction of the quantum well layer are fixed by the desired emission wavelength (e.g., 980 nm). While the thickness and indium fraction of the quantum well layer may be varied to a small extent, they are not free to be varied over a wider range.

Another way considered by the inventors to increase the confinement of carriers in InGaAs/GaAs quantum wells of the active region of a 980 nm VCSEL is to increase the fraction of indium in the InGaAs quantum well layer. However, increasing the indium fraction increases strain in the quantum well structure and also shifts the emission wavelength. To counteract the wavelength shift that would otherwise occur as the result of increasing the indium fraction in the InGaAs quantum well layer, the thickness of the quantum wells can be decreased as the indium fraction is increased. However, excessive strain reduces reliability of the VCSEL, and reducing the thickness of the quantum well layer leads to reduced carrier confinement.

As will be described in detail below, embodiments of the invention provide a method for increasing the maximum modulation speed of a light emitting device without introducing increased strain, and without necessarily reducing the thickness of the quantum well layers. In one embodiment, a higher maximum modulation speed is achieved by increasing the carrier confinement in the quantum well structure by using AlGaAs as the material of the barrier layers. AlGaAs barrier layers provide increased carrier confinement by reducing the rate at which carriers escape from the quantum well. The greater band gap energy of AlGaAs compared with GaAs, the conventional barrier layer material, reduces the carrier escape rate. Moreover, AlGaAs with a relatively small fraction of aluminum has a lattice constant similar to that of GaAs, so using AlGaAs as the barrier layer material does significantly change the strain in the quantum well structure.

Another mechanism by which the InGaAs/AlGaAs quantum well structure provides an increased carrier confinement relative to a conventional InGaAs/GaAs quantum well structure is that the InGaAs/AlGaAs quantum well structure has more abrupt interfaces between the InGaAs quantum well layer and the AlGaAs barrier layers. One contributor to the abrupt interface is the InGaAs of the quantum well layer and the AlGaAs of the barrier layers having the same group V sublattice. This tends to reduce interdiffusion between the quantum well layer and the adjacent barrier layers. Also, the Al—As bond is much stronger than the Ga—As bond, so an InGaAs/AlGaAs quantum well structure tends to have less interdiffusion and, hence, more abrupt interfaces, than a conventional InGaAs/GaAs quantum well structure. Thus, adding Al to GaAs in the barrier layers reduces interdiffusion and, hence, provides more abrupt interfaces. The more abrupt interfaces reduce midgap states that cause non-radiant recombination.

Another mechanism by which the InGaAs/AlGaAs quantum well structure increases carrier confinement is that the InGaAs/AlGaAs quantum well structure has a greater offset factor $Q_c$ than a conventional quantum well structure. In the InGaAs/AlGaAs quantum well structure, the conduction band offset contributes more (65%) than the valence band offset (35%) to the band offset between the InGaAs quantum well layer and the AlGaAs barrier layers. This band line-up is favorable for a good confinement of electrons in the conduction band, and a good distribution of holes among the quantum wells in a multiple quantum well structure. The good hole distribution additionally contributes to better confinement of electrons in the conduction band due to long range electrostatic interaction forces between electrons and holes. The increased band gap energy of the barriers not only improves carrier confinement in the quantum wells, it also leads to a reduced carrier population in the higher energy states. Thus, the carrier concentration in the ground states is increased, which keeps the quasi Fermi levels close to the band edges at transparency.

Method for Improving Carrier Confinement

Figure 2:
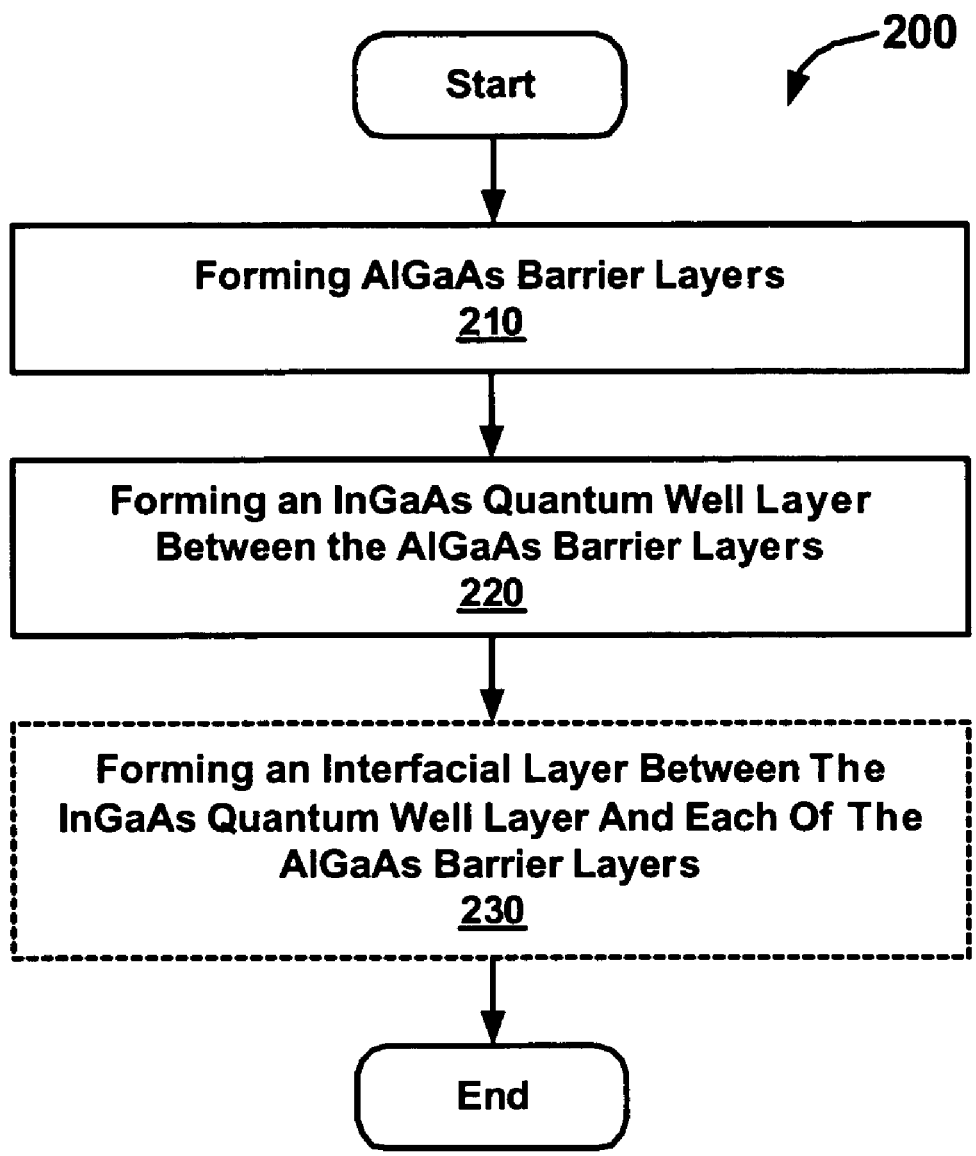
FIG. 2 is a flow chart illustrating a method for increasing carrier confinement in a vertical-cavity surface-emitting laser (VCSEL), in accordance with one embodiment of the invention.

FIG. 2 is flow chart illustrating a method 200 for increasing the modulation speed of a light emitting device in accordance with embodiments of the invention. The increased modulation speed is due primarily to increased carrier confinement in the quantum wells of the light emitting device. In this embodiment, the increased carrier confinement is achieved by increasing the effective band gap energy of the barrier layers to form a deeper quantum well.

In block 210, $Al_xGa_{1-x}As$ barrier layers are formed. In block 220, a quantum well layer of indium gallium arsenide (InGaAs) is formed between the barrier layers. In one embodiment, the barrier layers and the quantum well layer constitute part of the active region of a VCSEL.

Subjecting the quantum well layer to compressive strain improves such performance characteristics as differential gain and maximum modulation speed. The compressive strain to which the quantum well layer is subject is increased by increasing the indium fraction in the InGaAs material of the quantum well layer. Increased strain in the quantum well layer theoretically increases differential gain of the quantum well and the VCSEL. Increased differential gain contributes favorably to an increased maximum modulation speed. In one embodiment of the invention, the indium fraction is approximately 20 percent, i.e., the material of the quantum well layer is $In_{0.2}Ga_{0.8}As$. Other embodiments of the present invention have quantum well layers of material having indium fractions of greater than 20 percent, i.e., the material of the quantum well layer is $In_xGa_{1-x}As$, where x>0.2.

The present embodiment increases carrier confinement in the InGaAs quantum well layer to increase the modulation speed of the VCSEL, as described above. This is achieved by reducing the escape rate of carriers captured in the quantum well layer by using $Al_xGa_{1-x}As$ as the material of the barrier layers of the quantum well structure. More specifically, barrier layers of $Al_xGa_{1-x}As$, which has a greater band gap energy than GaAs, reduce the escape rate of electrons captured in the conduction band of the quantum well layer.

A reduction in the escape rate of carriers captured in the InGaAs quantum well layer increases the carrier confinement factor of the quantum well structure in the present embodiment. The carrier confinement factor scales the carrier density parameters of the quantum well layer to properly reflect the actual current density in the quantum well layer. As a result, in the present embodiment, the carrier confinement factor correctly contributes to the calculation of the differential gain of the quantum well layer, and ultimately the modulation speed of the VCSEL comprising the InGaAs/AlGaAs quantum well. By increasing the carrier confinement factor, embodiments in accordance with the invention increase the maximum modulation speed of the VCSEL.

Current density was conventionally determined from the carrier density directly without any consideration of the carrier capture and escape characteristics of the quantum well structure. Consequently, calculating differential gain did not provide an accurate representation of the performance characteristics of the quantum well structure. In contrast, the present embodiment addresses carrier confinement in both carrier capture and carrier escape terms and provides an accurate representation of the performance characteristics of the quantum well structure in a given VCSEL.

By using $Al_xGa_{1-x}As$ as the material of the barrier layers, the present embodiment increases the carrier confinement factor by reducing the escape rate of carriers captured in the InGaAs quantum well layer. Increasing the carrier confinement factor of the quantum well layer increases the maximum modulation speed of the VCSEL.

The carrier confinement factor is determined by the ratio of the carrier capture rate $\gamma_{capture}$ to the carrier escape rate $\gamma_{escape}$, as shown in Equation 1:

$$\text{Carrier Confinement Factor} = \frac{\gamma_{capture}}{\gamma_{escape}} \quad (1)$$

The carrier capture rate $\gamma_{capture}$ is described as the probability of carrier capture, and is inversely proportional to the time of carrier capture. In other words, the higher the carrier capture rate, the higher the probability of carrier capture, and the shorter the time needed to capture the carrier in the quantum well. Also, the carrier escape rate $\gamma_{escape}$ is described as the probability of carrier escape, and is inversely proportional to the time of carrier escape. A reduction in the carrier escape rate leads to a reduction in the probability of captured carriers escaping, and indicates that it takes longer for carriers captured in the quantum well to escape.

Reducing the carrier escape rate $\gamma_{escape}$ increases the carrier confinement factor, in accordance with the invention. The carrier escape rate is reduced by increasing the energy difference between the conduction band of the quantum well layer and that of the adjacent barrier layers to better confine captured electrons in the conduction band of the quantum well layer. That is, embodiments in accordance with the invention increase this energy difference by using a material with an increased band gap energy as the material of the barrier layers sandwiching the quantum well layer. In the present embodiment, the material of the barrier layers is $Al_xGa_{1-x}As$, which has a greater conduction band energy than GaAs, the conventional barrier layer material. Specifically, the present embodiment increases the energy difference between the conduction band energy of the quantum well layer and that of the adjacent barrier layers from approximately 80 meV obtained with conventional GaAs barrier layers to over 100 meV obtained with the $Al_xGa_{1-x}As$ barrier layers of the present embodiment.

FIG. 2 also shows an optional additional element of method 200. At 230, an interfacial layer is formed between the InGaAs quantum well layer and each of the $Al_xGa_{1-x}As$ barrier layers. The benefits provided by the interfacial layer will be described below.

In a light emitting device in accordance with embodiments of the invention, the $Al_xGa_{1-x}As$ barrier layers provide increased electron carrier confinement in the quantum well layer, and consequently, a reduction in the carrier escape rate $\gamma_{escape}$. As an added benefit, the increased barrier height of the $Al_xGa_{1-x}As$ barrier layers compared to conventional GaAs barrier layers also increases the carrier capture rate $\gamma_{capture}$. Thus, the $Al_xGa_{1-x}As$ barrier layers in embodiments in accordance with the invention increase the carrier confinement factor by increasing the carrier capture rate and reducing the carrier escape rate.

Also, as an added benefit, the $Al_xGa_{1-x}As$ barrier layers of the present embodiment increase the differential gain of the VCSEL. The increase in differential gain is a result of the increase in the carrier confinement. As described above, the above-described increase in the carrier confinement factor provides the increase in carrier confinement.

In addition, the increased band gap energy of the $Al_xGa_{1-x}As$ material of the barrier layers allows the thickness of both the InGaAs quantum well layer and the $Al_xGa_{1-x}As$ barrier layers to be proportionately reduced without affecting the differential gain. A decrease in the thickness of the quantum well layer reduces the carrier confinement, but this reduction is offset by the above-described increase in carrier confinement resulting from the greater band gap energy of $Al_xGa_{1-x}As$ as the material of the barrier layers.

Carrier confinement is one factor that determines the material gain of the InGaAs quantum well layer of the quantum well structure of the VCSEL. Increased carrier confinement in the quantum well leads to material gain properties that provide an overall increase in the differential gain of the quantum well structure. In other words, the increased carrier confinement increases the rate at which material gain changes with current density. Carrier density is defined as the product of current density in the quantum well structure and the carrier confinement factor, as shown in Equation 2.

$$\text{Carrier Density} = (\text{Current Density}) \times (\text{Carrier Confinement Factor}) \quad (2)$$

The slope of the material gain versus current density characteristic determines the differential gain. In turn, the relaxation frequency of the quantum well is directly proportional to the differential gain. The relaxation frequency characterizes the natural oscillation of electrons and photons when the VCSEL is generating light, and limits the modulation speed of the VCSEL. The higher the relaxation frequency, the higher the maximum modulation speed of the VCSEL. Thus, increasing the carrier confinement increases the slope of material gain versus current density characteristic, i.e., increases the differential gain. The increased differential gain increases the relaxation frequency, which in turn increases the maximum modulation speed of the VCSEL.

Quantum Well Structure Providing Improved Carrier Confinement

Figure 3A:
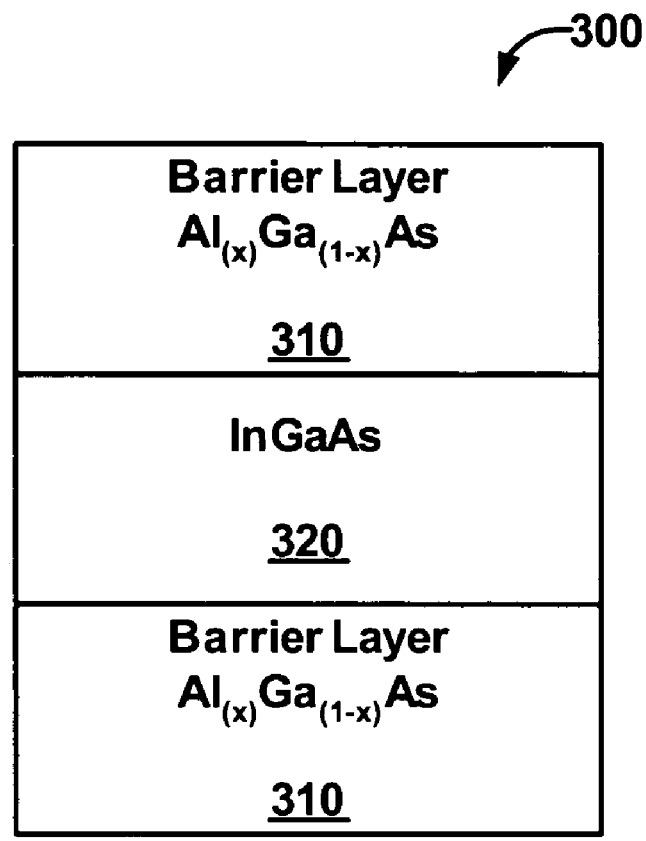
FIG. 3A is a diagram illustrating a quantum well structure having AlGaAs barrier layers in accordance with one embodiment of the invention. The quantum well structure provides increased carrier confinement.

FIG. 3A is a schematic diagram of a quantum well structure 300 that provides improved carrier confinement in accordance with embodiments of the invention. In one embodiment, quantum well structure 300 forms part of the active region of a VCSEL. More specifically, in one embodiment, quantum well structure 300 forms part of the active region of a VCSEL that generates light at a wavelength of approximately 980 nm.

Quantum well structure 300 is composed of a quantum well layer 320 of indium gallium arsenide (InGaAs) and barrier layers 310 of aluminum gallium arsenide (AlGaAs) that sandwich quantum well layer 320. A lattice mismatch exists between the AlGaAs of barrier layers 310 and the InGaAs of quantum well layer 320 so that quantum well structure 300 is strained. Specifically, the indium in the InGaAs of quantum well layer 320 subjects the quantum well layer to a compressive strain that changes the characteristics of the material of the quantum well layer in a way that increase the differential gain of the quantum well structure 300. As described above, the fraction of indium in the material of the InGaAs quantum well layer 320 determines the magnitude of the strain and is approximately equal to or greater than 20 percent.

The barrier layers 310 that sandwich InGaAs quantum well layer 320 are composed of aluminum gallium arsenide $Al_xGa_{1-x}As$. An aluminum fraction of greater than 5 percent in the $Al_xGa_{1-x}As$ of barrier layers 310 increases the barrier height between the conduction band of InGaAs quantum well layer 320 and the conduction band of $Al_xGa_{1-x}As$ barrier layers 310, as described above with reference to FIG. 2.

Moreover, the aluminum fraction in the $Al_xGa_{1-x}As$ material of barrier layers 310 is low enough that material with good electrical and optical properties can be grown using a standard epitaxial growth process. For example, the epitaxial growth process is molecular beam epitaxy (MBE) in accordance with one embodiment of the invention. In accordance with another embodiment of the invention, the epitaxial growth process is metal-organic chemical vapor deposition (MOCVD).

Figure 3B:
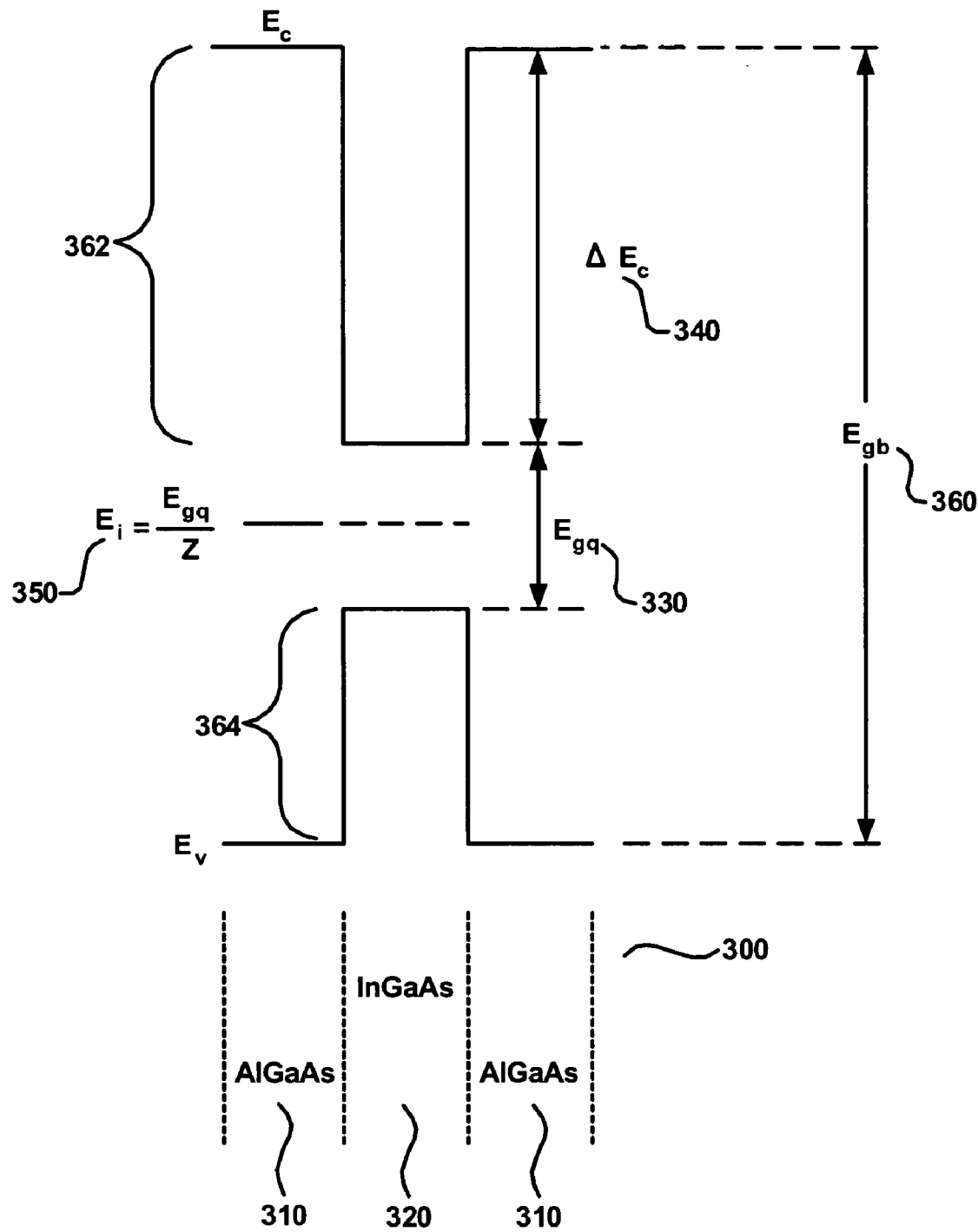
FIG. 3B is an energy diagram illustrating the band energy profile of the quantum well structure shown in FIG. 3A.

FIG. 3B is an energy diagram of quantum well structure 300 shown in FIG. 3A in accordance with one embodiment of the invention. The energy diagram additionally shows the structural elements of quantum well structure 300. The energy diagram is illustrative of a flat-band condition in which no electric field is applied to quantum well structure 300. The band gap energy $E_{gq}$ 330 is shown for the transition between the lowest-energy subbands (n=1) for an electron and a heavy-hole in the flat-band condition of quantum well layer 320. The band gap energy $E_{gb}$ 360 is shown for barrier layers 310. The upper portion 362 of the energy diagram shows the conduction band energy $E_c$ of the barrier layers and quantum well layer. The lower portion 364 of the energy diagram shows the valence band energy $E_v$ of the barrier layers and quantum well layer.

In addition, FIG. 3B shows the barrier height $\Delta E_c$ 340 between the conduction band of the InGaAs quantum well layer 320 and the conduction band of the $Al_xGa_{1-x}As$ barrier layers 310. The barrier height $\Delta E_c$ 340 achieved in accordance with the embodiment is greater than in a conventional quantum well structure using GaAs barrier layers, and is obtained without additional strain in quantum well structure 300. As stated above, additional strain will cause a reduction in performance and reliability of the quantum well structure 300 by reducing efficiency and differential gain. The increase in barrier height $\Delta E_c$ 340 is achieved without additional strain in quantum well structure 300 because the lattice constants of aluminum arsenide and gallium arsenide are similar. Consequently, adding aluminum to gallium arsenide does not significantly change the strain in quantum well structure 300.

Additionally, the increase in barrier height $\Delta E_c$ 340 is achieved in accordance with the invention without causing any midgap states to form in the InGaAs quantum well layer 320. FIG. 3B illustrates a midgap state $E_i$ 350 that could potentially exist in quantum well structure 300. The energy $E_i$ 350 of the midgap state differs from the valance band energy of quantum well layer 320 by one half the value of the band gap energy $E_{gq}$ 330 of the quantum well layer. Recombination at any midgap state that exists increases non-radiant recombination. As described above, midgap states are caused by the increased strain that results when the indium fraction in the quantum well layer is increased in an effort to increase barrier height $\Delta E_c$ 340. However, in accordance with the invention, barrier layers 310 of $Al_xGa_{1-x}As$ increase the barrier height $\Delta E_c$ 340 without increasing strain in the quantum well structure 300 and without promoting the formation of midgap states. The non-radiant recombination that can occur when such states exist is therefore prevented.

Using AlGaAs as the material of the barrier layers 310 also increases the barrier height $\Delta E_c$ 340 without incurring intravalence band scattering. The additional strain that results from the conventional approach of using an indium fraction greater than 20 percent (e.g., in conventional InGaAs/GaAs quantum well structures) to increase the barrier height leads to a wider separation of the light hole and heavy hole states in the valence band. The wider separation leads to gain suppression in the quantum well structure since it takes longer for light holes to fall to the ground state occupied by the heavy holes. Radiant recombination occurs only with the heavy holes. However, barrier layers 310 of $Al_xGa_{1-x}As$ in accordance with the invention increase the barrier height $\Delta E_c$ 340 without incurring additional strain or gain suppression.

In embodiments in accordance with the invention, quantum well structure 300 shown in FIG. 3A has abrupt interfaces between quantum well layer 320 and barrier layers 310. The abrupt interfaces are due to the InGaAs of quantum well layer 320 and the AlGaAs of barrier layers 310 having the same group V sublattice. The abrupt interfaces produce good optical qualities of the quantum well and limit broadening of the gain spectrum. In addition, in a quantum well structure in accordance with the invention, the abrupt interfaces between the $Al_xGa_{1-x}As$ barrier layers 310 and the InGaAs quantum well layer 320 have fewer defects. The reduced number of defects reduces the incidence of nonradiant recombination.

High Band Gap Energy Offset Factor

InGaAs/$Al_xGa_{1-x}As$ quantum well structure 300 in accordance with embodiments of the invention has a greater band gap energy offset factor $Q_c$ than a conventional quantum well structure. The band gap energy offset factor characterizes the relative contributions of the conduction band and the valence band to the offset in band gap energy between the quantum well layer and the barrier layers. The band gap energy offset factor is described below in Equation 3.

$$Q_c = \Delta E_c / \Delta E_g \quad (3)$$

In equation 3, $\Delta E_c$ is as described above with reference to barrier height $\Delta E_c$ 340. $\Delta E_g$ is the difference between the band gap energy of the barrier layer (i.e., $E_{gb}$ 360) and the band gap energy of quantum well layer 320 (i.e., $E_{gq}$ 330), as shown below in Equation 4:

$$\Delta E_g = E_{gb} - E_{gq}. \quad (4)$$

Embodiments of InGaAs/$Al_xGa_{1-x}As$ quantum well structure 300 give a high value of $Q_c$, especially when compared to conventional InGaAs/GaAsP quantum wells. For example InGaAs/$Al_xGa_{1-x}As$ quantum well structure 300 has a $Q_c$ value of approximately 0.65, whereas a conventional InGaAs/GaAsP quantum well structure has a $Q_c$ value of approximately 0.4.

The high value of $Q_c$ of InGaAs/$Al_xGa_{1-x}As$ quantum well structure 300 produces conditions for increasing the confinement of electrons and, in a multi-quantum well structure, a more uniform distribution of holes. For instance, the $Q_c$ value of 0.65 of InGaAs/$Al_xGa_{1-x}As$ quantum well structure 300 indicates that the conduction band contributes 65 percent of the band gap energy difference and the valance band contributes 35 percent of the band gap energy difference between InGaAs quantum well layer 320 and $Al_xGa_{1-x}As$ barrier layers 310.

A 65/35 split between the contributions of the conduction band and the valence band increases confinement of electrons in the conduction band of the InGaAs quantum well layer 320 due to the greater barrier height $\Delta E_c$ 340 between quantum well layer 320 and barrier layers 310. The 65/35 split does not significantly increase hole confinement, since the conduction bands provide most of the band gap energy offset. An increase in hole confinement reduces the maximum modulation speed of the VCSEL due to uneven and/or slower carrier transport.

As noted above, the increased $Q_c$ value of quantum well structure 300 in accordance with the invention provides a more uniform hole distribution in a multiple quantum well structure. A lower $Q_c$ value, such as that of an InGaAs/GaAsP quantum well structure, increases hole confinement, which degrades the uniformity of the hole distribution among the multiple quantum wells. This is because the increased hole confinement confines most of the holes in the quantum well closest to the p-type spacer layer 20 (FIG. 1B) that injects the holes into the quantum well structure. As a result, the conventional multiple quantum well structure with a low $Q_c$ value suffers from a non-uniform distribution of its hole population.

In embodiments in accordance with the invention, InGaAs/AlGaAs quantum well structure 300 has a high $Q_c$ value of approximately 0.65. This provides an increased electron confinement and, in a multiple quantum well structure, a more uniform hole distribution. The increase in electron confinement increases differential gain and modulation speed and improves the temperature characteristics of the VCSEL of which the quantum well structure forms a part.

Multiple Quantum Well Structure Having Improved Carrier Confinement

Figure 4:
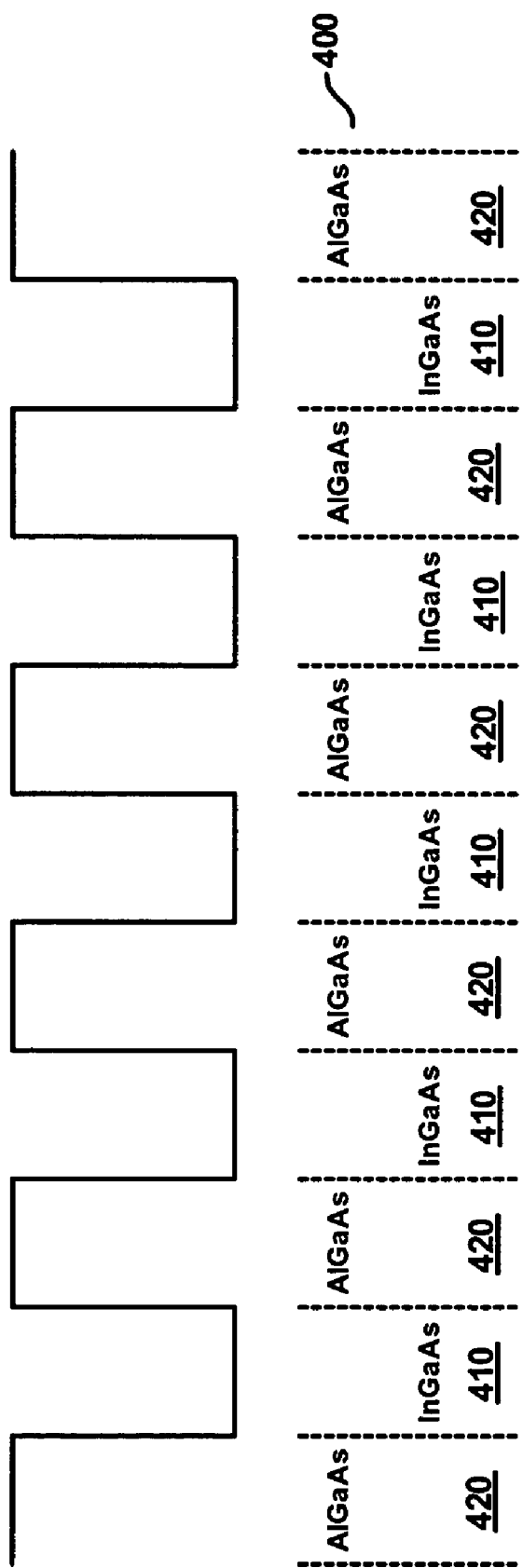
FIG. 4 is an energy diagram illustrating the band energy profile of the conduction band of a quantum well structure having multiple quantum wells in accordance with one embodiment of the invention. The quantum well structure exhibits increased carrier confinement

FIG. 4 is an energy diagram of the conduction band of a multiple quantum well structure 400 in accordance with embodiments of the invention. While the example shown is the multiple quantum well structure of a 980 nm VCSEL, other embodiments are well suited for use in VCSELs operating at other wavelengths.

Multiple quantum well structure 400 is composed of N InGaAs quantum well layers 410 interleaved with (N+1) $Al_xGa_{1-x}As$ barrier layers 420, where N is an integer. Other embodiments of the present invention additionally have an interfacial layer (not shown, but described below with reference to FIG. 5A) between each quantum well layer 410 and the barrier layers 420 adjacent thereto. Compared with a single quantum well structure, multiple quantum well structure 400 inherently provides an increased carrier capture rate ($\gamma_{capture}$) since it has more quantum wells to capture the carriers.

For a VCSEL to lase, the optical gain of the VCSEL must overcome the VCSEL's optical loss. The quantum well structure uses material gain to compensate for the optical loss. In a single quantum well structure, the single quantum well must deliver all the material gain needed to compensate for the optical loss. Producing the high material gain requires strict fabrication and growth techniques.

In a multiple quantum well structure, such as multiple quantum well structure 400 shown in FIG. 4, the material gain is shared among the quantum wells. Each quantum well in a multiple quantum well structure need not have as high a material gain as the quantum well of a single quantum well structure. Since each quantum well in a multiple quantum well structure provides less material gain, the quantum well can operate at a lower carrier (and therefore current) density. Operating in the lower carrier density part of the material gain vs. carrier density characteristic results in each of the quantum wells operating with higher differential gain and with lower carrier leakage. Additionally, the optical confinement factor for the transverse electric field is much higher for the multiple quantum well structure. Thus, a significant performance improvement can be expected from increasing the number of quantum wells.

A typical VCSEL is caused to lase by passing a current through the VCSEL. Current injection causes the quasi-Fermi level of the conduction band in the energy diagram shown in FIG. 4 to rise towards the band edge of the $Al_xGa_{1-x}As$ barrier layers 420. This increases the escape rate of electrons. However, in a multiple quantum well structure, the quasi-Fermi level is closer to the band edge due to the above-described lower material gain of the quantum wells. For a given carrier density, the material gain of each quantum well is maximized as the quasi-Fermi levels move toward the band edge. Using AlGaAs as the material of barrier layers 420 increases the barrier height $\Delta E_c$ provided by the quantum wells. This reduces the rate at which captured electrons escape from quantum well layers 410.

Also, as described above, the increased band gap energy of the $Al_xGa_{1-x}As$ barrier layers 420 allows the thicknesses of both the InGaAs quantum well layers 410 and the $Al_xGa_{1-x}As$ barrier layers to be reduced without impairing the differential gain. The increase in carrier confinement resulting from the increased band gap energy of the $Al_xGa_{1-x}As$ barrier layers offsets the reduction in carrier confinement resulting from decreasing the thickness of the quantum well layer. The reduction in thicknesses of the quantum well layers and barrier layers allows the density of the quantum wells to be increased. For VCSELs of similar dimensions, this leads to an improvement in the differential gain due to the increased carrier capture provided by the greater number of quantum wells in the same space. The optical confinement factor is also enhanced by the use of multiple quantum wells.

A VCSEL incorporating an embodiment of multiple quantum well structure 400 provides advantages over a VCSEL having a single quantum well structure. For example, the multiple quantum well structure has a greater carrier capture rate ($\gamma_{capture}$). In addition, the multiple quantum well structure has a lower carrier escape rate ($\gamma_{escape}$) due to each quantum well having a lower material gain, and the resulting increased barrier height $\Delta E_c$. In combination, these factors provide a greater carrier confinement factor, which leads to better carrier confinement, increased differential gain, and ultimately the multiple quantum well VCSEL having a greater maximum modulation speed.

Reduction of Coupling Between Quantum Wells

Figure 5A:
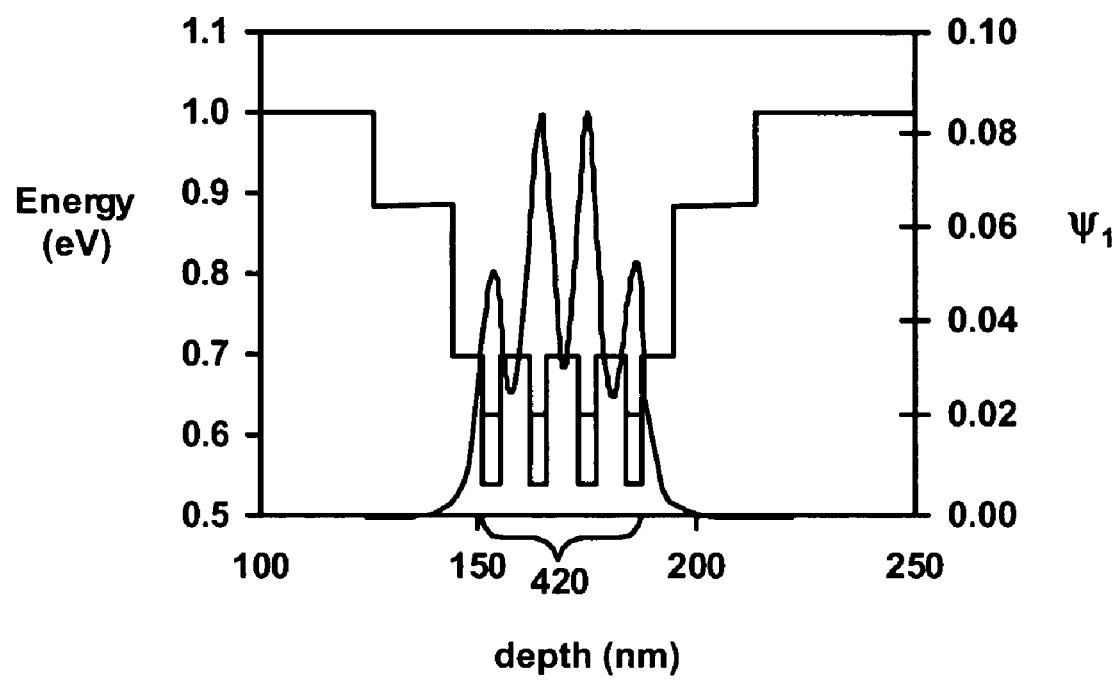
FIG. 5A is an energy diagram of an exemplary active region having a InGaAs/GaAs multiple quantum well structure with a curve representing the wavefunction of electrons confined in the quantum well structure superimposed thereon.

An additional advantage of barrier layers of AlGaAs over barrier layers of GaAs is reduced coupling between the quantum wells of a multiple quantum well structure. A high coupling between quantum wells can lead to reduced gain. FIG. 5A is an energy diagram of an exemplary active region having a multiple quantum well structure composed of four 4.3 nanometer (nm)-thick quantum well layers of $In_{0.23}Ga_{0.77}As$ interleaved with five 7.0 nm-thick barrier layers of GaAs. Superimposed on the energy diagram is a curve representing the wavefunction of the electrons confined in the quantum well structure. FIG. 5A shows substantial leakage of the wavefunction out of the quantum wells whose extent is indicated by the brace 420. The calculated confinement factor for the wavefunction shown in FIG. 5A is about 69% while the calculated miniband width for the first eigenstate of the quantum well structure is about 1.0 meV.

Figure 5B:
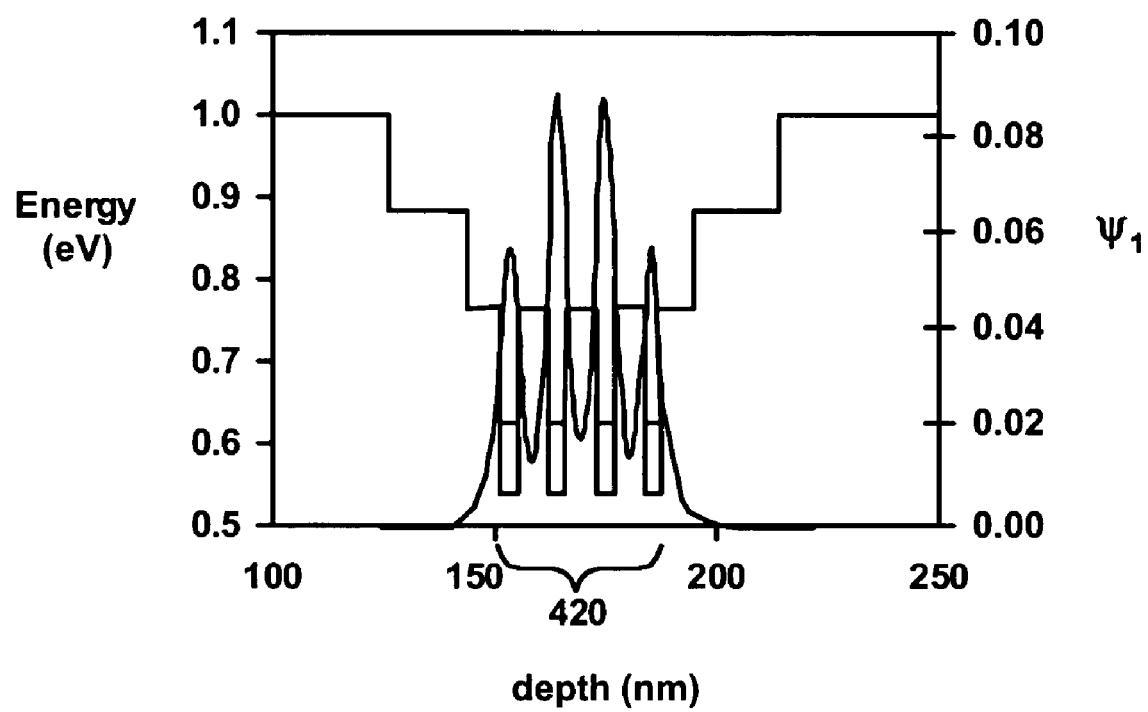
FIG. 5B is an energy diagram of an exemplary active region having a InGaAs/AlGaAs multiple quantum well structure with a curve representing the wavefunction of electrons confined in the quantum well structure superimposed thereon.

FIG. 5B is an energy diagram of an exemplary active region incorporating a quantum well structure composed of four 4.3 nm-thick quantum well layers of $In_{0.23}Ga_{0.77}As$ interleaved with five 7.0 nm-thick barrier layers of $Al_{0.1}Ga_{0.9}As$. Superimposed on the energy diagram is a curve representing the wavefunction of the electrons confined in the quantum well structure. The emission wavelength of the active region shown in FIG. 5B is the same as that shown in FIG. 5A. Using AlGaAs as the material of the barrier layers results in a calculated confinement factor of 82% for the wavefunction. This is a substantial improvement over the confinement factor of the quantum well structure with GaAs barrier layers shown in FIG. 5A. Also, the calculated miniband width of the first eigenstate is reduced. Comparing FIG. 5B with 5A shows that using AlGaAs as the material of the barrier layers reduces coupling between quantum wells. The reduced coupling allows the number of quantum wells in the active region to be increased without a reduction in gain or broadening of the linewidth.

Figure 6A:
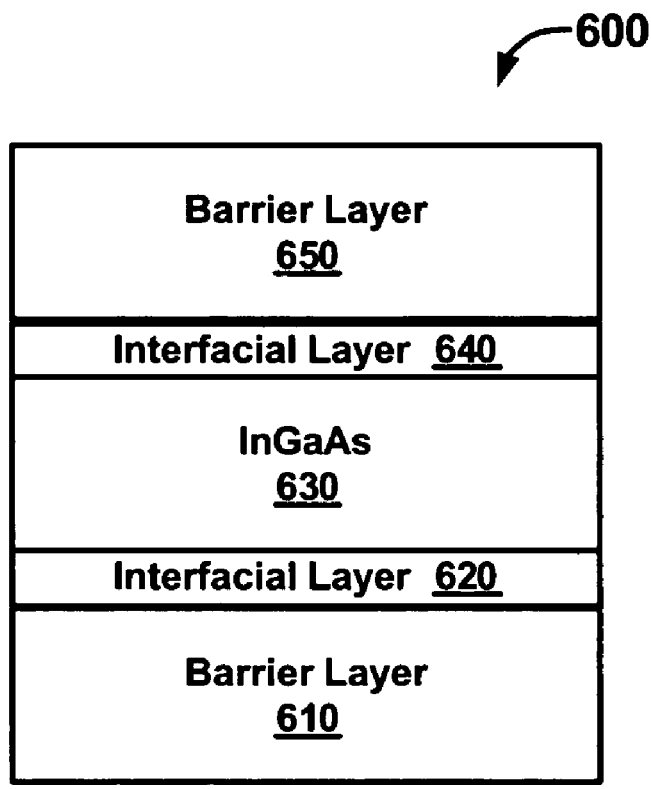
FIG. 6A is a diagram of a quantum well structure having interfacial layers between the quantum well layer and the adjacent barrier layers in accordance with one embodiment of the invention. The quantum well structure exhibits increased carrier confinement

Quantum Well Structure with Interfacial Layers for Improving Carrier Confinement FIG. 6A shows an exemplary quantum well structure 600 in which interfacial layers are interposed between the quantum well layer and the barrier layers in accordance with one embodiment of the present invention. The interfacial layers improve the carrier confinement of the quantum well structure. Quantum well structure 600 constitutes part of the active region of a light emitting device, such as a VCSEL. In the present embodiment, the quantum well structure constitutes part of the active region of a VCSEL that generates light at a wavelength of 980 nm. However, other embodiments of quantum well structure 600 are well suited to incorporation in VCSELs that generate light at other wavelengths. The improved carrier confinement provided by the interfacial layers gives quantum well structure 600 an increased differential gain and relaxation frequency compared with a conventional quantum well structure. The increased relaxation frequency increases the maximum modulation speed of quantum well structure 600 and of the VCSEL of which quantum well structure 600 forms a part.

Quantum well structure 600 is composed of a barrier layer 610, a barrier layer 650 and a quantum well layer 630 of InGaAs between barrier layer 610 and barrier layer 650. The bulk lattice constant of the InGaAs of quantum well layer 630 is greater than that of the material of barrier layers 610 and 650, so quantum well layer 630 is subject to compressive strain.

Quantum well structure 600 is additionally composed of interfacial layers 620 and 640 interposed between quantum well layer 630 and barrier layers 610 and 650, respectively. The material of interfacial layers 620 and 640 is $Al_yGa_{1-y}As$ in which the aluminum fraction y is less than the aluminum fraction x in the $Al_xGa_{1-x}As$ of barrier layers 610 and 650. In one embodiment, the Al fraction in the AlGaAs of interfacial layers 620 and 640 is zero, i.e., the material of interfacial layers 620 and 640 is GaAs. Interfacial layers 620 and 640 have a thickness in the range from approximately 0.1 nm to approximately 2 nm in accordance with one embodiment of the invention.

Interfacial layer 620 is sandwiched between barrier layer 610 and quantum well layer 630. Interfacial layer 640 is sandwiched between barrier layer 650 and quantum well layer 630. Each interfacial layer reduces the broadening of the gain spectrum of quantum well structure 600 that would otherwise result from imperfect interfacing between quantum well layer 630 and the respective one of barrier layers 610 and 650.

Interfacial layers 620 and 640, respectively, additionally increase the effective carrier capture cross-section of quantum well structure 600. The capture of a carrier in quantum well layer 630 involves the relaxation of the energy of the carrier from its energy in one of the barrier layers 610 and 650 to the ground state energy of the conduction band of quantum well layer 630. Interfacial layers 620 and 640 provide a more gradual relaxation of the energy of carriers that pass through them. This translates into an increased probability of carriers being captured in the quantum well layer, and an increase in the carrier capture rate ($\gamma_{capture}$) of electrons. In turn, the carrier capture rate $\gamma_{capture}$ increases the carrier confinement factor, as described above, which increases the differential gain and relaxation frequency. The increased relaxation frequency increases the maximum modulation speed of quantum well structure 600.

Figure 6B:
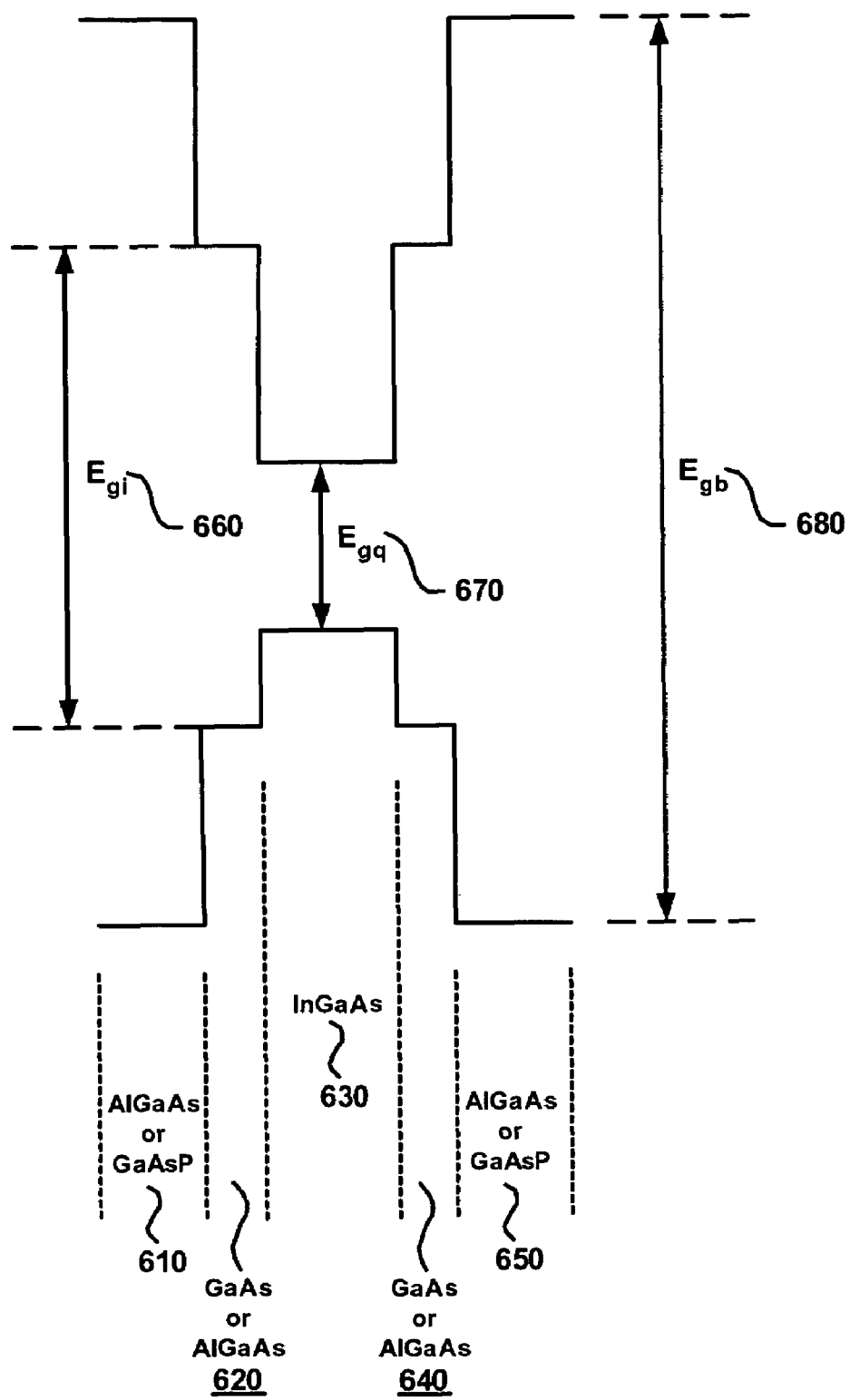
FIG. 6B is an energy diagram illustrating the band energy profile of the quantum well structure shown in FIG. 6A.

FIG. 6B is an energy diagram of quantum well structure 600 shown in FIG. 6A. FIG. 6B shows the band gap energies of barrier layers 610 and 650, interfacial layers 620 and 640, and quantum well layer 630 of quantum well structure 600. FIG. 6B also shows the structural elements of quantum well structure 600. The band gap energy $E_{gi}$ 660 between the conduction band and the valence band of interfacial layers 620 and 640 is intermediate between the band gap energy $E_{gq}$ 670 of InGaAs quantum well layer and the band gap energy $E_{gb}$ 680 of barrier layers 610 and 650.

In one embodiment, the material of barrier layer 610 and of barrier layer 650 is $Al_xGa_{1-x}As$ having an Al fraction x greater than 5 percent (x>0.05).

In another embodiment in accordance with the invention, the interfacial layers 620 and 640, respectively, enable the material of barrier layers 610 and 650 to be GaAsP. Conventional quantum well structure with barrier layers of GaAsP have a reduced carrier confinement due to imperfections in the InGaAs/GaAsP interface broadening the gain spectrum of the quantum well structure. However, interfacial layers 620 and 640 increase the effective carrier capture cross-section of the quantum well structure 600. This mitigates the effect of the reduced carrier confinement resulting from using barrier layers of GaAsP, and leads to a corresponding increase in differential gain and relaxation frequency. The increased relaxation frequency increases the maximum modulation speed of quantum well structure 600.

This disclosure describes the invention in detail with reference to illustrative embodiments. However, the invention defined by the appended claims is not limited to the precise embodiments described.

We claim:

1. A method for increasing the maximum modulation speed of a light emitting device, the method comprising:
   forming barrier layers of AlGaAs;
   forming an quantum well layer of InGaAs between said barrier layers; and
   forming an interfacial layer between said quantum well layer and each of said barrier layers, wherein said interfacial layers are formed of at least one of GaAs and AlGaAs, and wherein said forming said interfacial layer comprises forming said interfacial layer of AlGaAs having a lower aluminum fraction than said AlGaAs of said barrier layers.

2. The method of claim 1, wherein said InGaAs of said quantum well layer has an indium fraction greater than 20 percent.

3. The method of claim 1, wherein:
said forming said quantum well layer comprises forming a plurality of quantum well layers of InGaAs, said quantum well layers interleaved with said barrier layers; and
said forming said interfacial layer comprises forming an interfacial layer between each of said quantum well layers and adjacent ones of said barrier layers.

4. The method of claim 1, wherein said forming said barrier layers comprises forming said barrier layers of AlGaAs having an aluminum fraction greater than 5 percent.

5. The method of claim 1, additionally comprising structuring said light-emitting device to generate light at a wavelength of 980 nm.

6. A vertical cavity surface emitting laser (VCSEL), comprising:
a quantum well structure comprising quantum well layers of InGaAs interleaved with barrier layers of AlGaAs; and
an interfacial layer between each of said quantum well layers and adjacent ones of said barrier layers for increasing carrier confinement in said quantum well structure, said increased carrier confinement increasing the maximum modulation speed of said VCSEL, wherein said interfacial layers are formed of at least one of GaAs and AlGaAs, and wherein said interfacial layers comprise AlGaAs having a lower aluminum fraction than said AlGaAs of said barrier layers.

7. The VCSEL of claim 6, wherein said interfacial layers are additionally for reducing a broadening of the gain spectrum of said quantum well structure caused by imperfect interfacing between said quantum well layers and said barrier layers.

8. The VCSEL of claim 6, wherein said interfacial layers comprise an increased density of quantum wells in said quantum well structure.

9. The VCSEL of claim 6, wherein said AlGaAs of said barrier layers has an aluminum fraction greater than 5 percent.

10. The VCSEL of claim 6, wherein said InGaAs of said quantum well layers has an indium fraction of greater than 20 percent.

11. The VCSEL of claim 6, structured to generate light at a wavelength of 980 nm.

12. A quantum well structure for a light emitting device, the quantum well structure comprising:
barrier layers comprising AlGaAs having an aluminum fraction greater than 5 percent;
InGaAs quantum well layers interleaved with said barrier layers; and
between each one of said quantum well layers and each adjacent one of said barrier layers, an interfacial layer of a material that mitigates the effect of imperfect interfacing between said one of said quantum well layers and said adjacent one of said barrier layers, wherein said interfacial layers are formed of at least one of GaAs and AlGaAs, and wherein said interfacial layers comprise AlGaAs having an aluminum fraction less than said aluminum fraction of said AlGaAs of said barrier layers.

13. The quantum well structure of claim 12, wherein said interfacial layers are configured to increase the effective carrier capture cross-section of a quantum well comprised of said one of said quantum well layers and said adjacent ones of said barrier layers.

14. A quantum well structure for a light emitting device, the quantum well structure comprising:
barrier layers;
InGaAs quantum well layers interleaved with said barrier layers; and
between each one of said quantum well layers and each adjacent one of said barrier layers, an interfacial layer of a material that mitigates the effect of imperfect interfacing between said one of said quantum well layers and said adjacent one of said barrier layers, wherein said interfacial layers are formed of at least one of GaAs and AlGaAs wherein said barrier layers each comprise GaAsP.

15. The quantum well structure of claim 12, structured to generate light at 980 nm.

* * * * *

UNITED STATES PATENT AND TRADEMARK OFFICE
CERTIFICATE OF CORRECTION

| | |
|---|---|
| PATENT NO. | : 7,269,196 B2 |
| APPLICATION NO. | : 10/885952 |
| DATED | : September 11, 2007 |
| INVENTOR(S) | : Ashish Tandon |

Page 1 of 1

It is certified that error appears in the above-identified patent and that said Letters Patent is hereby corrected as shown below:

Col. 15 Line 17 In Claim 5, delete "of" and insert -- as described in --, therefor.

Signed and Sealed this

Seventeenth Day of February, 2009

JOHN DOLL
*Acting Director of the United States Patent and Trademark Office*